United States Patent
Ding et al.

(10) Patent No.: US 6,449,135 B1
(45) Date of Patent: Sep. 10, 2002

(54) OVERLAID MR STRUCTURE WITH MAGNETOSTATIC STABILIZED SOFT ADJACENT LAYER

(75) Inventors: Juren Ding, Lakeville; Song Sheng Xue, Edina; Juan Fernandez-deCastro, Burnsville; James Dolejsi, Chanhassen; Patrick Joseph Ryan, St. Paul, all of MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/180,560

(22) PCT Filed: Sep. 22, 1998

(86) PCT No.: PCT/US98/19732
§ 371 (c)(1),
(2), (4) Date: Nov. 6, 1998

(87) PCT Pub. No.: WO99/16057
PCT Pub. Date: Apr. 1, 1999

Related U.S. Application Data
(60) Provisional application No. 60/059,484, filed on Sep. 22, 1997.

(51) Int. Cl.[7] ................................................. G11B 5/39
(52) U.S. Cl. .............................. 360/327.31; 360/327.23
(58) Field of Search ........................ 360/327.1, 327.31, 360/327.33, 327.22, 327.23

(56) References Cited

U.S. PATENT DOCUMENTS

| 5,434,826 A | 7/1995 | Ravipati et al. ............. 360/113 |
| 5,458,908 A | 10/1995 | Krounbi et al. ............. 427/123 |
| 5,491,600 A | 2/1996 | Chen et al. ................. 360/113 |
| 6,111,730 A | * 8/2000 | Fernandez-de-Castro 360/327.1 |

* cited by examiner

*Primary Examiner*—George J. Letscher
(74) *Attorney, Agent, or Firm*—Kinney & Lange, P.A.

(57) ABSTRACT

The present invention is a magnetoresistive (MR) sensor (100) that combines the advantages of abutted junction structure and regular overlaid structure. The abutted junction design is used with the soft adjacent layer (SAL) (108) and the overlaid structure is used with the MR element (120). The method of making the MR sensor (100) comprises depositing SAL (108) on top of the gap layer (106) and depositing spacer material (110) on top of the SAL (108). A mask (130) is placed over the central region of the spacer material (110) and SAL (108). The spacer material (110) and SAL (108) are removed in the areas not covered by the mask (130). An underlayer material (112) is deposited in the areas where the SAL (108) and spacer material (110) were removed. A hard-biasing material (114) is deposited on top of the underlayer (112). The mask (130) is removed and the MR element (120) is deposited on top of the spacer material (110) in the active region of the sensor (132) and on top of the hard-biasing material (114) in the passive regions of the sensor (134, 136). A cap layer (122) is deposited on top of the MR element (120) in the active (132) and passive regions (134, 136) of the MR sensor (100). Contacts (124) are placed on top of the cap layer (122) in the passive regions of the sensor (134, 136).

In another embodiment of the method, additional material is added to separate the hard-biasing material (114), thus improving the signal to noise ratio. A low resistivity material (116) is added after the first hard-biasing material (114) and a second hard-biasing material (118) is deposited on top of the low-resistivity material (116). The additional materials are deposited before the mask (130) is removed. Once the mask (130) is removed, the MR senor (100) is built in accordance with the first embodiment.

15 Claims, 5 Drawing Sheets

OVERLAID MR STRUCTURE WITH MAGNETOSTATIC STABILIZED SOFT ADJACENT LAYER

This application is a Section 371 national phase application from PCT International Application Number PCT/US98/19732, filed Sep. 22, 1998, which claims priority from U.S. Provisional Application Number 60/059,484, filed Sep. 22, 1997.

BACKGROUND OF THE INVENTION

The present invention relates generally to a magnetoresistive (MR) sensor. More specifically, the present invention relates to an MR read sensor and a method of fabricating the sensor that combines the advantages of abutted junction structure and overlaid structure.

Magnetoresistive (MR) sensors utilize an MR element to read magnetically encoded information from a magnetic medium, such as a disc, by detecting magnetic flux stored on the magnetic medium. An MR sensor must contain both longitudinal bias and transverse bias to maintain the sensor in its optimal operating range so that it can properly detect the magnetic flux. The dual biasing is established through various combinations of magnetic exchange coupling or magnetostatic coupling.

The three critical layers of an MR sensor are the MR element, a spacer material and a soft adjacent layer (SAL). The MR element has magnetoresistive properties and low resistivity and generates an output voltage when a sense current flows through the layer. The SAL is a magnetic bias layer with high resistivity. The SAL biases the magnetization of the MR element and establishes transverse biasing. The spacer material has non-magnetic properties and high resistivity and functions as a spacer between the MR element and SAL. The spacer material helps break the exchange coupling between the MR element and the SAL, which allows the magnetic layers to act as two distinct layers, rather than one strongly coupled layer. Hard-biasing material is placed on each end of the MR sensor, to establish longitudinal biasing and form two passive regions of the sensor. The space between the passive regions maintains the transverse biasing and is referred to as the active region of the sensor.

MR and SAL elements can "fracture" into multiple magnetic domains when they are exposed to an external magnetic field. To maximize the stability and output of the MR sensor, it is desirable to maintain the MR and SAL element in a single domain state. Three methods for maintaining the MR and SAL elements in a single domain state are magnetostatic coupling, ferromagnetic exchange coupling and antiferromagnetic exchange coupling. Magnetostatic coupling is accomplished by positioning a permanent magnet adjacent to the MR element. This type of stabilization scheme is known as abutted junction. Exchange coupling is accomplished by depositing a ferromagnetic or antiferromagnetic layer adjacent to the MR layer so that one of the magnetic lattices of the magnetic layer couples with the magnetic lattice of the MR element layer to preserve the single domain state of the sensor. This type of stabilization is referred to as an overlaid structure.

In existing MR sensors, alignment tolerances between various thin film layers and sensor mask features are critical. The alignment tolerances in many prior art MR sensor designs greatly increases the complexity of processing because critical geometries frequently require additional and/or more difficult processing steps. Additional processing steps increase the variance and contamination of the various thin film layers.

For example, designs using continuous MR element and SAL films in both the active and passive areas of the sensor are sensitive to the underlayer of the film. In the passive region of the sensor, the SAL film functions as the underlayer for hard-biasing Cobalt-based alloy films. Cobalt-based hard-biasing films are inherently sensitive to the underlayer crystal texture and to the cleanness and roughness of the SAL/Cobalt-alloy film interface. Also in the passive region, the Cobalt-alloy film fictions as the underlayer for the MR element. The MR element is sensitive to various factors such as the underlayer crystal texture, cleanness and roughness of the Cobalt-alloy film/MR element interface. The dependence of one film to the other makes the process control inherently difficult in fabricating this type of sensor.

In addition, processes involving reactive ion etching or ion milling often require stopping within a very small tolerance, such as 50 Angstroms. These processes leave the surface of the film layer compromised and affect the exchange coupling. The dependence of one film to an adjacent film makes exchange coupling very critical and affects the overall stability of the MR sensor.

One method for simplifying the process of making an MR sensor is by utilizing an abutting magnetoresistive head. The abutted head appears simple with respect to sensor fabrication. Essentially, a thin MR layer extends over the central active region and a hard-magnetic material is formed over the passive regions. The reliability of the sensor, however, is affected by the abutted junctions between the passive and active regions, which introduce complications in the magnetic and electrical properties at these junctions.

Therefore, there is a continuing need for an MR sensor that stabilizes the MR element while reducing the coupling dependence of adjacent films and eliminating the process of reactive ion etching or ion milling. In addition, the MR sensor needs to stabilize the SAL element, yet allow enough rotation of the magnetization so that it can properly bias the MR element.

BRIEF SUMMARY OF THE INVENTION

The present invention is a magnetoresistive (MR) sensor that combines the advantages of abutted junction structure and regular overlaid structure. The abutted junction design is used with the SAL and the overlaid structure is used with the MR element. The abutted junction design uses magnetostatic coupling to stabilize the SAL while allowing the magnetization to rotate. The magnetization must be free to rotate to provide proper magnetostatic coupling between the SAL and MR element. The overlaid structure provides stabilzation to the MR element, but it also eliminates the sensitivity of the abutted junction by laying the MR element adjacent to a hard-biasing film, which allows magnetic exchange coupling. The overlaid structure removes the processing variations usually associated with the abutted junction design. In addition, the combination provides better magnetostatic coupling between the SAL and MR element because the abutted junction design allows more movement of the SAL magnetization, which has a stronger biasing effect on the MR element.

In a second embodiment of the sensor, the hard-biasing film or permanent magnet is separated, to provide the SAL and MR elements with separate hard-biasing films for magnetostatic coupling and magnetic exchange coupling, respectively. The magnetic properties and strength of each permanent magnet can be independently optimized for each of the SAL and MR elements. This allows a more consistent, cleaner and easier to control process, which eliminates variations of permanent magnet properties from sensor to sensor.

A method of making an MR sensor in accordance with the present invention comprises depositing SAL on top of the gap layer and depositing spacer material on top of the SAL. A mask is placed over the central region of the spacer material and SAL. The spacer material and SAL are removed in the areas not covered by the mask. Then, an underlayer material is deposited in the areas where the SAL and spacer material were removed. A hard-biasing material is deposited on top of the underlayer. The mask is removed and the MR element is deposited on top of the spacer material in the active region of the sensor and on top of the hard-biasing material in the passive regions of the sensor. A cap layer is deposited on top of the MR element in the active and passive regions of the sensor. Contacts are placed on top of the cap layer in the passive regions of the sensor.

In a second embodiment of the method, additional material is added to separate the hard-biasing material. A low resistivity material is added after the first hard-biasing material and a second hard-biasing material is deposited on top of the low-resistivity material. The additional materials are deposited before the mask is removed. Once the mask removed, the sensor is built in accordance with the first embodiment.

DETAILED DESCRIPTION OF THE PREFERRED EMBODIMENTS

Figure 1:
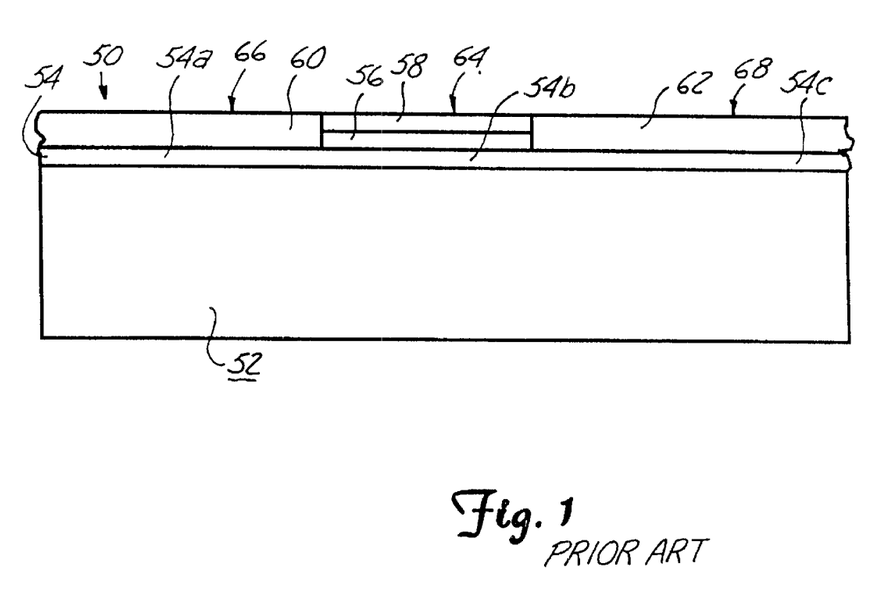
FIG. 1 is a sectional view of a prior art magnetoresistive read sensor in which the spacer and soft adjacent layers are positioned only in the central active region.

FIG. 1 is a sectional view of the reader portion of prior art magnetoresistive (MR) sensor 50. The sectional view shown in FIG. 1 is taken from a plane parallel to the air bearing surface of the sensor. In other words, the air bearing surface of MR sensor 50 is parallel to the plane of the page.

MR sensor 50 is positioned on top of substrate or gap layer 52 and includes MR element 54, spacer layer 56, soft adjacent layer (SAL) 58, and first and second permanent magnets or hard-biasing materials 60 and 62. MR element 54 includes first passive region 54a, second passive region 54c, and active region 54b, which is positioned between passive regions 54a and 54c. Hard-biasing material 60 is positioned at least partially on top of first passive region 54a of MR element 54. Likewise, hard-biasing material 62 is positioned at least partially on top of second passive region 54c of MR element 54.

Active region 64 of MR sensor 50 is formed between hard-biasing materials 60 and 62 and includes active region 54b of MR element 54, spacer layer 56, and SAL 58. First passive region 66 of MR sensor 50 is formed above first passive region 54a of MR element 54. First passive region 66 includes the portion of MR element 54 located in first passive region 54a and first hard-biasing material 60. Second passive region 68 of MR sensor 50 is formed above second passive region 54c of MR element 54. Second passive region 68 includes the portion of MR element 54 located in second passive region 54c and second hard-biasing material 62.

Spacer layer 56 is positioned between hard-biasing materials 60 and 62 and on top of active region 54a of MR element 54. SAL 58 is positioned on top of spacer layer 56 such that SAL 58 is also located between hard-biasing materials 60 and 62. Hard-biasing materials 60 and 62 provide the boundaries of active region 64 and make contact with spacer layer 56 and SAL 58. Hard-biasing materials 60 and 62 also define the boundaries of the active region 54a of MR element 54.

During fabrication, prior art MR sensor 50 is subjected to various process steps which increase the variance and tolerances of each film layer. Initially, MR element 54, spacer layer 56 and SAL 58 are deposited in all three regions (active region 64 and passive regions 66 and 68) of MR sensor 50. However, portions of spacer layer 56 and SAL 58 are removed from passive regions 66 and 68. First, SAL 58 is subjected to an ion-milling process to remove the portions of SAL 58 not covered by a photoresist. Next, spacer layer 56 is subjected to a reactive ion-etch process to remove the portions of spacer layer 56 not covered by a photoresist. In addition, MR element passive regions 54a and 54b are sputter-etched to remove a small portion of MR element 54 in order to establish a clean surface or underlayer for later deposition of hard-biasing materials 60 and 62. These processing steps are costly and make it difficult to control the magnetic properties of hard-biasing films. Thus, fabrication of a sensor such as sensor 50 is costly and may or may not be within predetermined tolerances.

Figure 8:
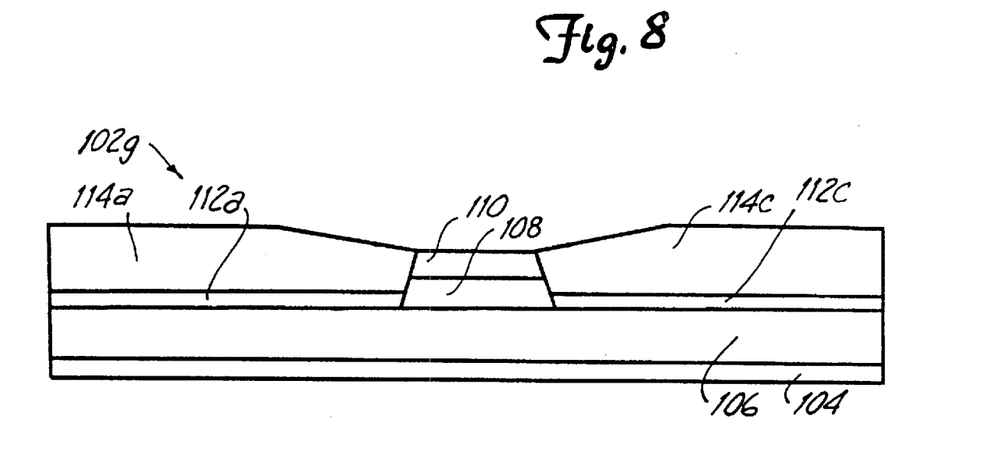
Figure 9:
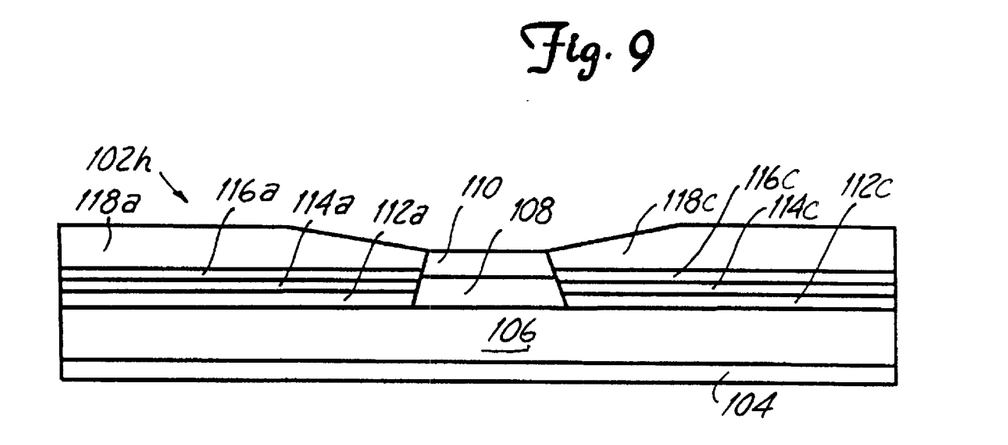
Figure 10:
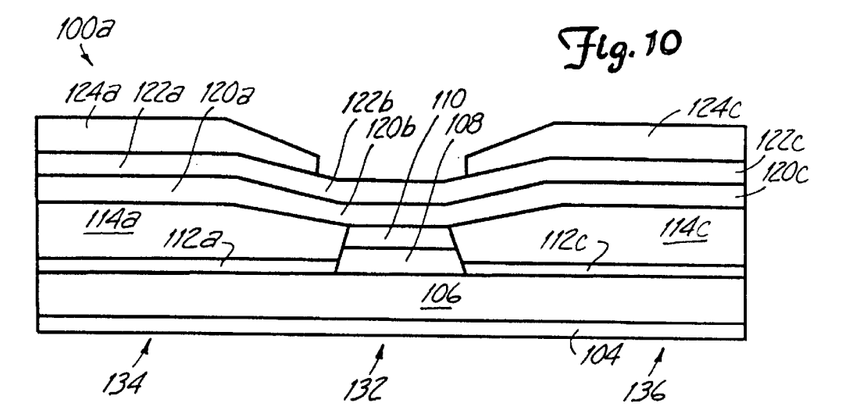
Figure 11:
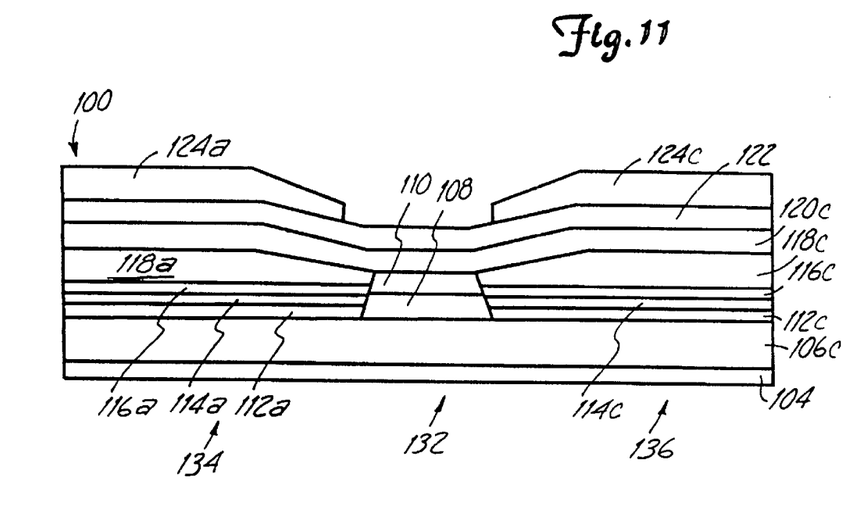

FIGS. 2–11 illustrate a process of forming MR sensor 100 according to the present invention. FIGS. 2–9 show structures 102a–102h at various phases of the fabrication of MR sensor 100, while FIGS. 10 and 11 show completed MR sensor 100, where each figure is a different embodiment of the present invention. The cross-sectional views of FIGS. 2–11 are taken from a plane parallel to the air bearing surface of the sensor. In other words, as with FIG. 1, the air bearing surface of MR sensor 100 is in a plane parallel to the plane of the page.

As shown in FIG. 10 MR sensor 100a is positioned on top of gap layer 106, which is adjacent to bottom shield 104. MR sensor 100a includes soft adjacent layer 108, spacer layer 110, underlayer 112 (112a, 112c), first hard-biasing material 114 (114a, 114c), MR element 120 (120a, 120b, 120c), cap layer 122 (122a, 122b, 122c) and first and second contacts 124a and 124c. Active region 132 of MR sensor 100a is defined by SAL 108, spacer layer 110, and active regions 120b and 122b of MR element and cap layer, respectively. First passive region 134 of MR sensor 100a is defined by first passive regions 112a, 114a, 120a, and 122a of underlayer 112, first hard-biasing material 114, MR element 120, and cap layer 122, respectively, and first contact 124a. Second passive region 136 of MR sensor 100a is defined by second passive regions 112c, 114c, 120c, and 122c of underlayer 112, first hard-biasing material 114, MR element 120, and cap layer 122, respectively, and second contact 124c. In addition, first mask 130, which includes photoresist 128 and PMGI 126 is used to fabricate MR sensor 100.

As shown in FIG. 11, MR sensor 100b is positioned on top of gap layer 106, which is adjacent to bottom shield 104. MR sensor 100b includes all the elements of 100a, but in addition includes low-resistivity material 116 (116a, 116c) and second hard-biasing material 118 (118a, 118c). Low resistivity material 116 and second hard-biasing material 118 are included in the first and second passive regions (134, 136) of MR sensor 100b.

Figure 2:
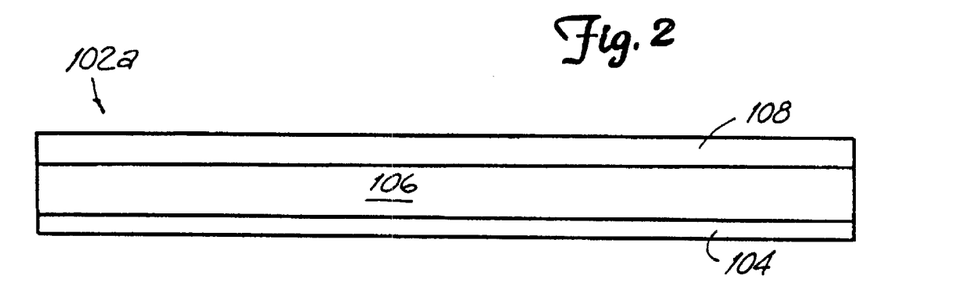
FIGS. 2–11 are sectional views illustrating the process of forming an MR sensor.

As shown in FIG. 2, SAL 108 is positioned on top of gap layer 106. Gap layer 106 is positioned between bottom shield 104 and MR sensor 100, where bottom shield 104 and gap layer 106 have varying thicknesses. Gap layer 104 is preferably made of a non-magnetic, insulating material with good thermal properties.

SAL 108 is preferably a layer of Sendust-type alloy which is made up of approximately 70 to 90% iron (Fe), up to 15% silicon (Si) and up to 15% aluminum (Al). Sendust-type alloys can also contain small amounts of additional elements, in dilute form, such as up to 5% titanium (Ti), chromium (Cr), vanadium (v), manganese (Mn), and/or zirconium (Zr), to name a few. The Sendust-type alloy forming SAL 108 can be formed in a variety of sputtering gases such as argon, neon, krypton, xenon and helium. SAL 108 can also be a layer of various ferromagnetic materials, for example nickel-iron-rhodium (NiFeRh), nickel-iron-rhenium (NiFeRe), or nickel-iron-chromium (NiFeCr), to name an additional few. In preferred embodiments, SAL 108 has a resistivity of greater than 100 $\mu\Omega$-cm to reduce current flow through the layer. SAL 108 has a preferred thickness of between 25 and 1000 Å and a saturation inductance of at least 3 kilo-Gauss to properly bias MR magnetic layer 120. In preferred embodiments, SAL 108 is a Sendust-type alloy, which provides a good underlayer for first hard-biasing material 114.

Figure 3:
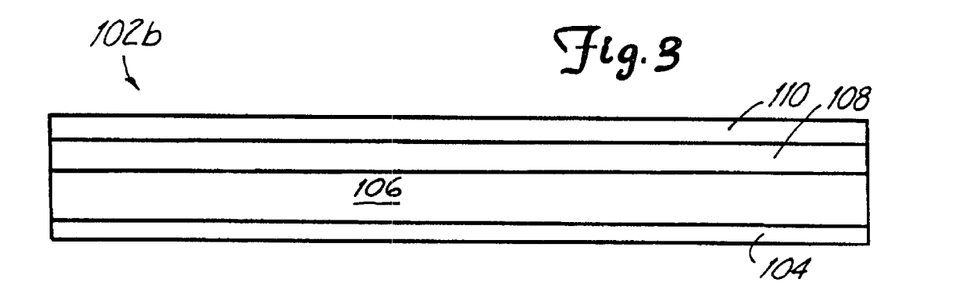

As shown in FIG. 3, spacer layer 110 is positioned on top of SAL 108. Spacer layer 110 is a non-magnetic layer of high resistivity material which is positioned between SAL 108 and MR element 120 to prevent magnetic exchange coupling between these two layers. The resistivity of spacer layer 110 is preferably substantially higher than that of MR element 120 so that the majority of the current flows through active region 120b of MR element 120, and increases the output voltage signal from MR element 120. In preferred embodiments, spacer layer 110 is a layer of tantalum (Ta) having a resistivity of at least 100 $\mu\Omega$-cm and a thickness of between 25 and 500 Å.

Figure 4:
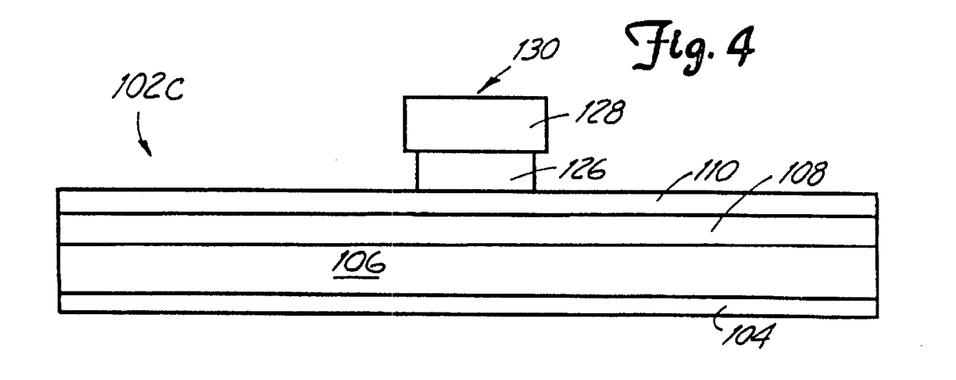

As shown in FIG. 4, a mask 130 is positioned above the central area of spacer layer 110 to protect the central area from future processing steps. In preferred embodiments, mask 130 includes photoresist 128 and PMGI 126, but is not limited to this combination of materials. The combination of PMGI and photoresist creates a pattern that provides good "lift-off" of photoresist 128 and any other materials above photoresist 128.

Figure 5:
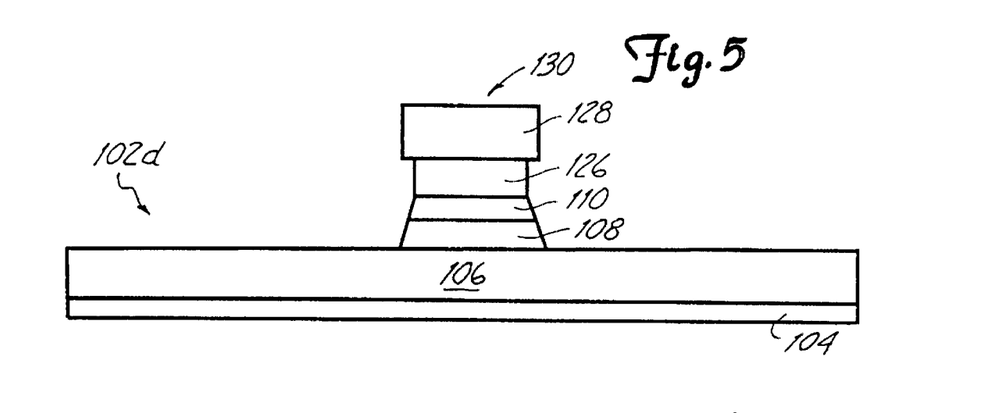

In FIG. 5, SAL 108 and spacer layer 110 are removed from the areas not defined by mask 130. SAL 108 is subjected to an ion-milling process to remove those portion of SAL 108 not covered by mask 130. Spacer layer 110 is subjected to a reactive ion-etch process to remove those portions of spacer layer 110 not covered by mask 130. This defines active region 132 and passive regions 134, 136 of the sensor as shown in FIGS. 10 and 11.

Figure 6:
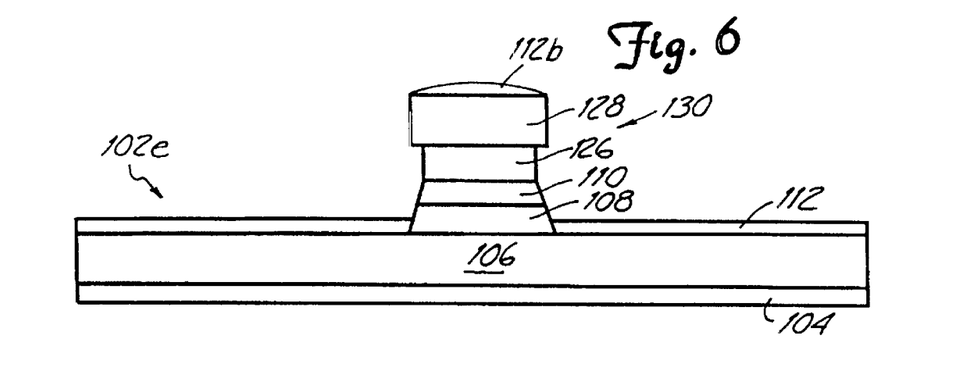

In FIG. 6, underlayer material 112 is deposited over structure 102d, shown in FIG. 5. Due to the configuration of structure 102d, underlayer material 112 forms three distinct sub-materials 112a, 112b and 112c. Underlayer maternal 112a and 112c are deposited on top of gap layer 106 and underlayer material 112b is deposited on top of mask 130, specifically photoresist 128. Underlayer material is preferably a Sendust-type alloy, which provides a good underlayer for first hard-biasing material 114.

Figure 7:
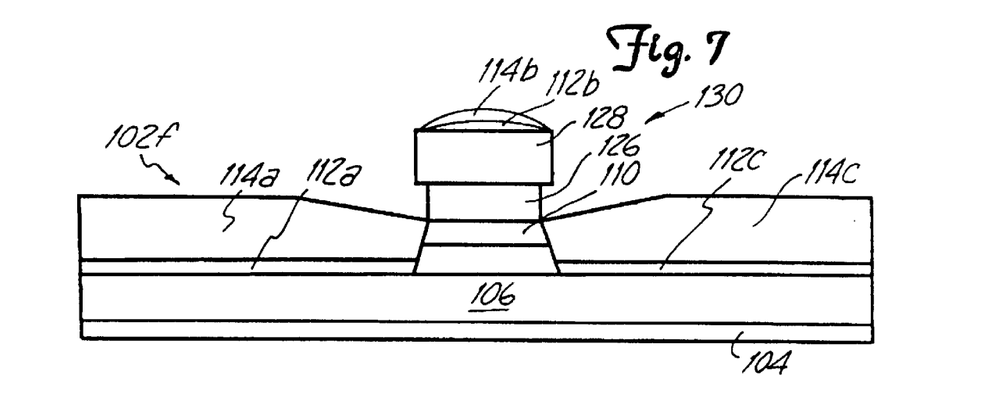

In FIG. 7, first hard-biasing material 114 is deposited over structure 102e, shown in FIG. 6. First hard bias material 114 forms three distinct sub-materials 114a, 114b, 114c. First hard-biasing material 114b is deposited on top of underlayer 112b, which is deposited on top of mask 130. First hard-biasing materials 114a and 114c are deposited on top of underlayer 112a and 112c, respectively. Hard-biasing material 114 is preferably formed from cobalt-based permanent magnet materials, but other materials can be used. In preferred embodiments, the thickness of hard-biasing material 110 at the outer edge of materials 110a and 110c is between 200 and 1000 Å.

In FIG. 8, mask 130 is removed using a lift-off process. The lift-off process removes photoresist 128 and PMGI 126. In addition, underlayer 112b and first hard-biasing material 114b is removed with mask 130. The combination of PMGI and photoresist creates a pattern which provides good "lift-off" of photoresist 128.

In FIG. 10, the final process steps of MR sensor 100a are shown. MR element 120, cap layer 122 and contacts 124 are deposited on top of structure 102g, shown in FIG. 8. MR element 120 and cap layer 122 are deposited across the active region 132 of sensor 100a and the first and second passive regions 134, 136 of sensor 100a.

MR element 120 is deposited first. Active region 120b of MR element 120 is deposited on top of spacer layer 110 and defines the active region of sensor 100a. Passive regions 120a and 120c of MR element 120 are deposited on top of hard-biasing material 114a and 114c, respectively. MR element 120 is, in preferred embodiments, a layer of permalloy. Permalloy is a name commonly used to identify any of a large number of highly magnetically permeable alloys containing a combination of nickel (Ni) and iron (Fe). It must be noted that other magnetoresistive materials can be used instead of permalloy. In preferred embodiments, MR element 120 has a resistivity of less than 100 $\mu\Omega$-cm and a thickness in the range of 25 and 400 Å.

Cap layer 122 is deposited on top of MR element 120 in all three regions, thus forming active region 122b of cap layer 122 and first and second passive regions 122a and 122c of cap layer 122. Cap layer 122 protects MR element 120 from future processing steps. In preferred embodiments, cap layer 122 is a layer of tantalum (Ta), but is not limited to this material.

Contacts 124a and 124c are deposited on top of the passive regions 122a and 122c of cap layer 122. The contacts connect MR sensor 100 to external circuitry for current input.

In FIG. 9, a second embodiment of the process used to form MR sensor 100 is shown. This step is associated with MR sensor 100b, shown in FIG. 11. The second embodiment of the present invention follows the steps described above with respect to FIGS. 2–7, or structure 102a–102f. After MR sensor 100 has achieved the structure of 102f, shown in FIG. 7, additional material is added to build M sensor 100b. The first additional material is low-resistivity material 116, which is deposited over structure 102f, shown in FIG. 7. The second material is second hard-biasing material 118, which is deposited on top of low-resistivity material 116 across the entire sensor. Low-resistivity material 116 and second hard-biasing material 118 are deposited while mask 130 is still positioned over spacer 110 and SAL 108. While low-resistivity material 116 and second hard-biasing material 118 are not shown in FIG.7, the result of removing mask 130 is shown in FIG. 9.

Low-resistivity material 116 is a material that conducts electricity more efficiently than hard-biasing materials 114 and 118. Hard-biasing materials 114 and 118 act as conductors for a certain length of MR sensor 100, but the material adds to the resistivity of the circuit and reduces the signal to noise ratio. The addition of a low-resistivity material between first hard-biasing material 114 and second hard-biasing material 118 reduces the resistance of the conductor and improves the signal to noise ratio. At the same time, the magnetic properties of hard-biasing materials 114 and 118 are maintained.

Second hard-biasing material 118 is preferably Formed from cobalt-based permanent magnet materials, but other materials can be used. In preferred embodiments, the thickness of hard-biasing material 110 at the outer edge of materials 110a and 110c is between 200 and 1000 Å.

In FIG. 11, the process steps of MR sensor 100b are finished. Once second hard-biasing material is positioned, the finishing steps of sensor 100b are identical to the steps of 100a, as explained above.

In preferred embodiments, transverse biasing is desired in active region 120b of MR element 120 and longitudinal biasing is desired in first and second passive reins 120a and 120c of MR element 120. MR element 120 is transverse biased when its magnetization vector is rotated using soft-film biasing, shunt biasing or any other compatible transverse bias technique. Longitudinal biasing is established using longitudinal hard-biasing films, such as cobalt-platinum, which suppress multiple domain formation in MR elements.

When MR element 120 is deposited, it will naturally form magnetization vector M along its long axis across the plane of the paper. Current density vector J is formed in MR element 120 as current passes through MR sensor 100 during operation. Current density vector J and magnetization vector M initially point in the same direction. When magnetization vector M and current density vector J form an angle of approximately 45 degrees, the resistance of MR element 120 will vary nearly linearly with the magnitude of magnetic flux entering MR element 120. Thus, transverse biasing of MR element 120 is desired to obtain optimal conditions for sensing magnetic flux from a disc.

Magnetization vector M is rotated by placing SAL 108 in a plane parallel MR element 120. The magnetic field of SAL 108 causes natural magnetization vector M of MR element 120 to be rotated approximately 45 degrees with respect to the direction of current density vector J. Spacer layer 110 is deposited between MR element 120 and SAL 108 to prevent magnetic exchange coupling between the layers, thereby permitting the rotation of magnetization vector M.

First and second passive regions 120a and 120c of MR element 120 are inhibited from magnetic rotation by the high coercivity, low permeability of hard-biasing materials through exchange coupling. The exchange coupling causes longitudinal biasing or suppression of the magnetic rotation because the geometries of MR element 120 and first hard-biasing material 114 (or second hard-biasing material 118 in the second embodiment) align. Inhibiting the magnetic rotation allows very little magnetic flux into first and second passive regions 120a and 120c, which establishes a well defined reader track width and increases the absorption of flux into active region 116b.

The amount and effectiveness of exchange coupling that exists between first or second hard-biasing materials 114, 118 and M element 120 depends upon a number of fabrication parameters. For instance, the material of MR element 120, the material of hard-biasing materials 114 and 118, the thickness of MR element 120, the thickness of hard-biasing materials 114 and 118 and the ratio between the thicknesses of materials all contribute to the effectiveness of exchange coupling. Deposition parameters such as sputtering pressure and temperature and post-deposition fabrication parameters such as ion-milling or etching also contribute to the effectiveness of exchange coupling.

In addition to thickness and deposition parameters, the underlayer of each film affects exchange coupling. Cobalt-based hard-biasing materials are inherently sensitive to the underlayer crystal texture, cleanness and roughness of the interfacing films. The dependence of one film to the other makes fabrication difficult. A desirable underlayer, such as amorphous Sendust or chromium, is chosen to control the characteristics of hard-biasing materials 114 and 118. Thus, underlayer material 112 and low-resistivity material 116 are chosen to provide a proper underlayer for first and second hard-biasing materials, 114 and 118.

MR and SAL elements can "fracture" into multiple magnetic domains when they are exposed to an external magnetic field. To maxmize the MR sensor's output and stability, it is desirable to maintain the MR and SAL element in a single domain state through exchange coupling or magnetostatic coupling. The magnetic field of the hard-biasing material should be large enough to ensure a single domain configuration, yet small enough so as not to change the linearity and signal amplitude of the resultant MR signal. The present invention combines the advantages of abutted junction structure and regular overlaid structure to stabilize the SAL and MR elements.

The abutted junction design is used to stabilize SAL 108. The abutted junction of SAL 108 and first hard-biasing material 114 produce magnetostatic coupling between the materials, which stabilizes SAL 108. The magnetostatic coupling places the SAL in a single magnetic domain structure, where the SAL is stabilized, but not overly stabilized such that the magnetization still causes magnetostatic coupling between the MR element and the SAL.

The overlaid structure provides stabilization to the MR element, but it also eliminates the sensitivity of the abutted junction by laying the MR element adjacent to a hard-biasing film, which allows magnetic exchange coupling. The overlaid structure removes the processing variations usually associated with the abutted junction design.

The present invention eliminates post-deposition steps of MR element 120, such as ion milling or etching. This eliminates the need to stop milling or etching within very small tolerances and avoids leaving the surface of film layers compromised. Therefore, better exchange coupling can take place between layers without the need for additional processing steps.

In the second embodiment of the present invention, the hard-biasing film or permanent magnet layer is separated into two layers 114, 118, which provides the SAL and MR elements with separate hard-biasing films for magnetostatic coupling and magnetic exchange coupling, respectively. The magnetic properties and strength of each permanent magnet can be independently optimized for each of the SAL and MR elements. This allows a more consistent, and easier to control process, which eliminates variations of permanent magnet properties from sensor to sensor. In addition, the signal to noise ratio is improved by sandwiching low-resistivity material 116 between first hard-biasing material 114 and second hard-biasing material 118. Low-resistivity material 116 provides better conduction in the hard-biasing or permanent magnet area of the sensor, which improves the signal to noise ratio.

In operation, the air bearing surface of MR sensor 100 is positioned adjacent a magnetic storage medium. The magnetic storage medium is moved so that the magnetic information located in the storage medium passes the active region of the MR sensor. A sense current flows through MR element 120. It is desirous to have an appropriate amount of sense current flow through magnetic layer 120 of MR sensor 100, in order to more effectively read information stored on the magnetic storage medium. Once the sense current has flowed through MR sensor 100, auxiliary circuitry reads the voltage, which represents the date stored on the magnetic storage medium.

Although the present invention has been described with reference to preferred embodiments, workers skilled in the art will recognize that changes may be made in form and detail without departing from the spirit and scope of the invention.

What is claimed is:

1. A magnetoresistive read sensor comprising:

a gap layer;

a soft adjacent layer on a center region of the gap layer, where first and second outside regions of the gap layer are separated by the center region;

a spacer layer on the soft adjacent layer;

an underlayer on the first and second outside regions of the gap layer, thereby forming first and second passive regions above the underlayer and an active region above the soft adjacent layer;

a first hard-biasing film on the underlayer in the first and second passive regions, the first hard-biasing film for biasing the soft adjacent layer;

a layer of low-resistivity material on the first hard-biasing film in the first and second passive regions;

a second hard-biasing film positioned on the layer of low-resistivity material in the first and second passive regions;

a magnetoresistive layer on the spacer layer and the second hard-biasing film such that it extends through the active region and the first and second passive regions with the second hard-biasing film biasing the magnetoresistive layer; and a cap layer on the magnetoresistive layer in the active region and the first and second passive regions.

2. The magnetoresistive read sensor of claim 1 and further comprising a plurality of contacts on the cap layer in the first and second passive regions.

3. The magnetoresistive read sensor of claim 1 wherein the magnetoresistive element is formed from a soft-magnetic material having a resistivity less than 100 $\mu\Omega$-cm.

4. The magnetoresistive read sensor of claim 1 wherein the spacer material is formed from a non-magnetic material having a resistivity of at least 100 $\mu\Omega$-cm.

5. The magnetoresistive read sensor of claim 1 wherein the soft adjacent material is formed from a soft-magnetic material having a resistivity of at least 100 $\mu\Omega$-cm.

6. A magnetoresistive read sensor comprising:

a first passive region comprising an underlayer, a first hard-biasing layer positioned on the underlayer, a layer of low-resistivity material positioned on the first hard-biasing layer, a second hard-biasing layer positioned on the layer of low-resistivity material, a first passive region of a magnetoresistive layer positioned on the second hard-biasing layer and a first passive region of a cap layer positioned on the first passive region of the magnetoresistive layer;

a second passive region comprising an underlayer, a first hard-biasing layer positioned on the underlayer, a layer of low-resistivity material positioned on the first hard-biasing layer, a second hard-biasing layer positioned on the layer of low-resistivity material, a second passive region of the magnetoresistive layer positioned on the second hard-biasing layer and a second passive region of the cap layer positioned on the second passive region of the magnetoresistive layer; and an active region separating the first and second passive regions, the active region including a soft adjacent layer, a spacer layer positioned on the soft adjacent layer, an active region of the magnetoresistive layer positioned on the spacer layer, and an active region of the cap layer positioned on the active region of the magnetoresistive layer, wherein the soft adjacent layer is magnetostatically-coupled to the first hard-biasing layer, and wherein the first and second passive regions of the magnetoresistive layer are exchange-coupled to second hard-biasing layers of respective first and second passive regions.

7. The magnetoresistive read sensor of claim 6 and further comprising first and second contacts on respective first and second regions of the cap layer.

8. The magnetoresistive read sensor of claim 6 wherein the magnetoresistive layer is formed from a soft-magnetic material having a resistivity less than 100 $\mu\Omega$-cm.

9. The magnetoresistive read sensor of claim 6 wherein the spacer layer is formed from a non-magnetic material having a resistivity of at least 100 $\mu\Omega$-cm.

10. The magnetoresistive read sensor of claim 6 wherein the soft adjacent layer is formed from a soft-magnetic material having a resistivity of at least 100 $\mu\Omega$-cm.

11. A magnetoresistive read sensor comprising:

a gap layer;

a soft adjacent layer on a center region of the gap layer, where first and second outside regions of the gap layer are separated by the center region;

a spacer layer on the soft adjacent layer;

an underlayer on the first and second outside regions of the gap layer, thereby forming first and second passive regions above the underlayer and an active region above the soft adjacent layer;

a first hard-biasing layer on the underlayer in the first and second passive regions;

a layer of low-resistivity material on the first hard-biasing layer in the first and second passive regions;

a second hard-biasing layer positioned on the layer of low-resistivity material in the first and second passive regions;

a magnetoresistive layer on the spacer layer and the second hard-biasing layer; and a cap layer on the magnetoresistive layer in the active region and the first and second passive regions.

12. The magnetoresistive read sensor of claim 11 and further comprising a plurality of contacts on the cap layer in the first and second passive regions.

13. The magnetoresistive read sensor of claim 11 wherein the magnetoresistive element is formed from a soft-magnetic material having a resistivity less than 100 $\mu\Omega$-cm.

14. The magnetoresistive read sensor of claim 11 wherein the spacer material is formed from a non-magnetic material having a resistivity of at least 100 $\mu\Omega$-cm.

15. The magnetoresistive read sensor of claim 11 wherein the soft adjacent material is formed from a soft-magnetic material having a resistivity of at least 100 $\mu\Omega$-cm.

* * * * *